United States Patent
French et al.

(10) Patent No.: US 9,930,446 B2
(45) Date of Patent: Mar. 27, 2018

(54) ACOUSTIC TRANSDUCER

(71) Applicant: Harman Becker Gepkocsirendszer Gyarto Korlatolt Felelossegu Tarsasag, Szekesfehervar (HU)

(72) Inventors: John B. French, Caledon East (CA); David Russell, Toronto (CA)

(73) Assignee: Harman Becker Gepkocsirendszer Gyarto Korlatoll Felelossegu Tarsasag, Szekesfehervar (HU)

(*) Notice: Subject to any disclaimer, the term of this patent is extended or adjusted under 35 U.S.C. 154(b) by 0 days.

(21) Appl. No.: 15/110,460

(22) PCT Filed: Jan. 9, 2015

(86) PCT No.: PCT/IB2015/000242
§ 371 (c)(1),
(2) Date: Jul. 8, 2016

(87) PCT Pub. No.: WO2015/104642
PCT Pub. Date: Jul. 16, 2015

(65) Prior Publication Data
US 2016/0337752 A1     Nov. 17, 2016

Related U.S. Application Data

(60) Provisional application No. 61/925,455, filed on Jan. 9, 2014.

(51) Int. Cl.
| | |
|---|---|
| *H04R 3/00* | (2006.01) |
| *H03F 3/183* | (2006.01) |
| *H04R 9/04* | (2006.01) |
| *H03F 3/217* | (2006.01) |

(Continued)

(52) U.S. Cl.
CPC ............... *H04R 3/00* (2013.01); *H03F 3/183* (2013.01); *H03F 3/217* (2013.01); *H04R 9/025* (2013.01); *H04R 9/04* (2013.01); *H04R 9/06* (2013.01)

(58) Field of Classification Search
None
See application file for complete search history.

(56) References Cited

U.S. PATENT DOCUMENTS

| | | |
|---|---|---|
| 5,146,142 A | 9/1992 | Van Tol |
| 6,208,742 B1 | 3/2001 | Garcia et al. |
| 8,139,816 B2 | 3/2012 | French et al. |

(Continued)

OTHER PUBLICATIONS

"Multiplexing." Multiplexing, Demultiplexing, TDM, FDM. DAEnotes, Oct. 11. 2011. Web. Feb. 13, 2017. <http://www.daenotes.com/electronics/communication-system/multiplexing>.*

(Continued)

*Primary Examiner* — Curtis Kuntz
*Assistant Examiner* — Kenny Truong
(74) *Attorney, Agent, or Firm* — Brooks Kushman P.C.

(57) ABSTRACT

The disclosure generally relates to acoustic transducers with stationary and moving coils, and methods for operating the acoustic transducers. Time varying signals are applied to the moving and stationary coils to control the movement of a diaphragm, which produces sound. The time varying signals are derived from a composite signal that is provided, via a pair of conductors, to the acoustic transducer. The time varying signals are derived based on various filter methods.

5 Claims, 3 Drawing Sheets

(51) Int. Cl.
H04R 9/06 (2006.01)
H04R 9/02 (2006.01)

(56) References Cited

U.S. PATENT DOCUMENTS

| | | | | |
|---|---|---|---|---|
| 2006/0103459 A1* | 5/2006 | Ma | ............................ | H03F 1/32 330/10 |
| 2007/0080745 A1* | 4/2007 | French | ...................... | H03F 1/34 330/10 |
| 2007/0246942 A1* | 10/2007 | Stahlhut | .................... | F01N 5/04 290/40 A |
| 2009/0190794 A1* | 7/2009 | French | ..................... | H04R 3/00 381/400 |
| 2013/0272563 A1 | 10/2013 | Boyd | | |

OTHER PUBLICATIONS

International Search Report and Written Opinion for corresponding Application No. PCT/IB2015/000242, dated Jul. 6, 2015, 10 pages.
International Preliminary Report for corresponding Application No. PCT/IB2015/000242, dated Jul. 21, 2016, 9 pages.

\* cited by examiner

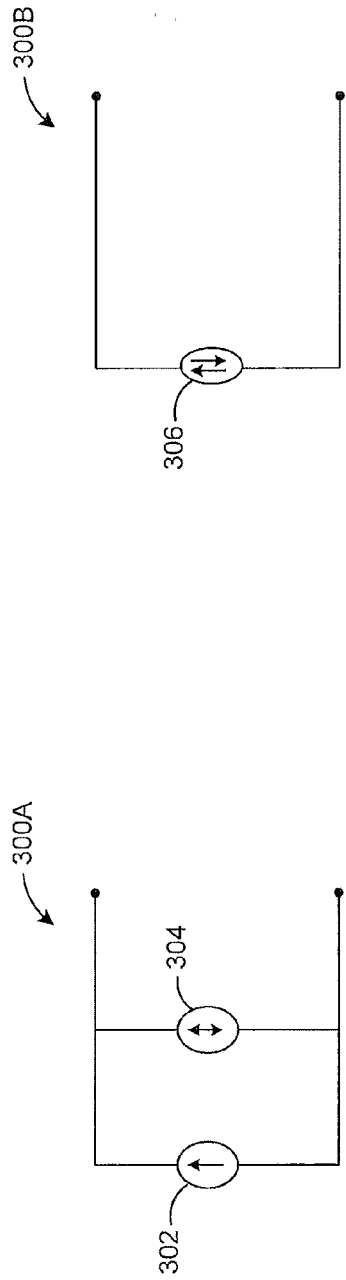
FIG. 3A
FIG. 3B
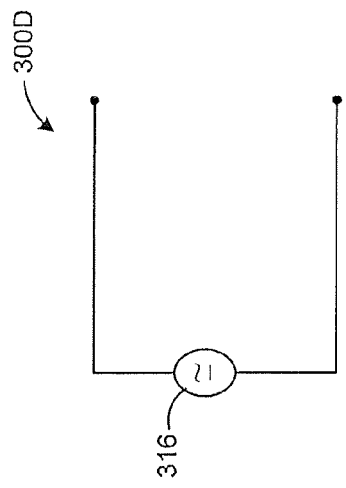
FIG. 3D
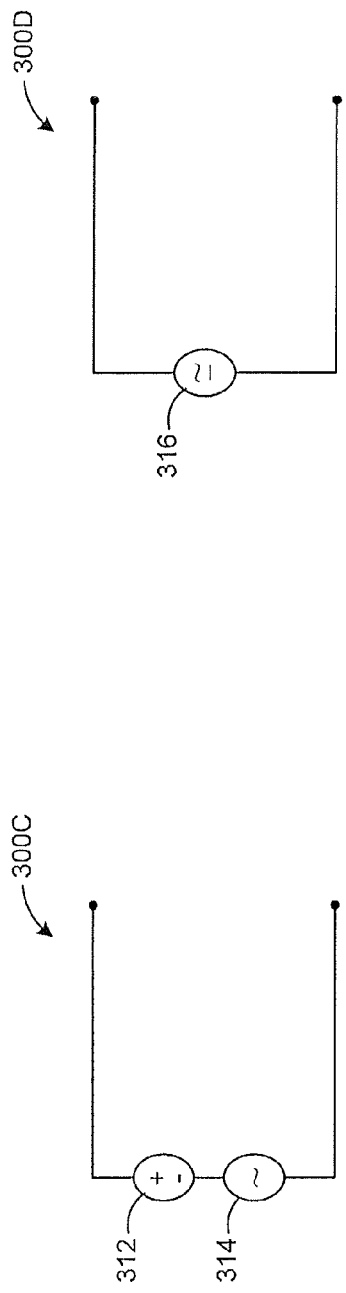
FIG. 3C

ACOUSTIC TRANSDUCER

CROSS-REFERENCE TO RELATED APPLICATIONS

This application is the U.S. national phase of PCT Application No. PCT/IB2015/000242 filed Jan. 9, 2015, which claims the benefit of U.S. provisional application Ser. No. 61/925,455 filed Jan. 9, 2014, the disclosures of which are incorporated in their entirety by reference herein.

TECHNICAL FIELD

The embodiments described herein relate to acoustic transducers.

BACKGROUND

Many acoustic transducers or drivers use a moving coil dynamic driver to generate sound waves. In most transducer designs, a magnet energizes magnetic flux within an air gap. The moving coil reacts with magnetic flux in the air gap to move the driver's diaphragm to produce sound. Initially, an electromagnet was used to create a fixed magnetic flux in the air gap. These electromagnet based drivers suffered from high power consumption. More recently, acoustic drivers have been made with permanent magnets. While permanent magnets do not consume power, they have limited BH products, can be bulky and depending on the magnetic material, they can be expensive. In contrast, the electromagnet based drivers do not suffer from the same BH product limitations.

There is a need for an electromagnet based acoustic transducer that incorporates the advantages of electromagnets while reducing the effect of some of their disadvantages.

SUMMARY

The embodiments described herein generally relate to acoustic transducers with stationary and moving coils, and methods for operating the acoustic transducers. Time varying signals are applied to the moving and stationary coils to control the movement of a diaphragm, which produces sound.

In accordance with some embodiments, there is provided a method of operating an acoustic transducer. The method includes receiving an input audio signal and generating a time-varying stationary coil signal based on the input audio signal. The method further includes generating a time-varying moving coil signal based on both the time-varying stationary coil signal and the input audio signal and providing a composite signal based on the time-varying stationary coil signal and the time-varying moving coil signal. The method further includes transmitting the composite signal on a pair of conductors and applying a filter process to the composite signal to (i) provide a stationary coil control signal to a stationary coil, wherein the stationary coil induces a magnetic flux in a magnetic flux path and the stationary coil control signal corresponds to one of the time-varying stationary coil signal and the composite signal and (ii) provide a moving coil control signal to a moving coil. The moving coil control signal corresponds to the other of the time-varying stationary coil signal and the composite signal and the moving coil is disposed within the magnetic flux path. The moving coil is coupled to a moving diaphragm which moves in response to the moving coil control signal.

In accordance with another embodiment, there is provided an acoustic transducer that includes an audio input terminal, a driver, a control system, a combiner component, and a filter component. The audio input terminal receives an input audio signal. The driver includes a moving diaphragm; a magnetic material having an air gap; a stationary coil for inducing magnetic flux in the magnetic material and the air gap; and a moving coil coupled to the diaphragm in which the moving coil is disposed at least partially within the air gap. The control system is adapted to generate a time-varying stationary coil signal based on the input audio signal and to generate a time-varying moving coil signal based on both the time-varying stationary coil signal and the input audio signal. The combiner component is adapted to provide a composite signal based on the time-varying stationary coil signal and the time-varying moving coil signal. The filter component is adapted to process the composite signal to (i) provide a stationary coil control signal for the stationary coil, wherein the stationary coil control signal corresponds to one of the time-varying stationary coil signal and the composite signal; and (ii) provide a moving coil control signal to the moving coil, wherein the moving coil control signal corresponds to the other of the time-varying stationary coil signal and the composite signal and the diaphragm moves in response to the moving coil control signal. The combiner component and the filter component are in electrical communication via a pair of conductors for transmitting the composite signal from the combiner component to the filter component.

In accordance with some embodiments, there is provided a method of operating an acoustic transducer. The method includes receiving an input audio signal and generating a time-varying stationary coil signal based on the input audio signal. The method further includes generating a time-varying moving coil signal based on both the time-varying stationary coil signal and the input audio signal and providing a composite signal based on the time-varying stationary coil signal and the time-varying moving coil signal. The method further includes transmitting the composite signal on a pair of conductors and applying a filter process to the composite signal. The method applies the filter process to (i) provide a stationary coil control signal to a stationary coil, wherein the stationary coil control signal corresponds to one of the time-varying stationary coil signal and the time-varying moving coil signal and the stationary coil induces a magnetic flux in a magnetic flux path and (ii) provide a moving coil control signal to a moving coil. The moving coil control signal corresponds to the other of the time varying stationary coil signal and the time-varying moving coil signal. The moving coil is disposed within the magnetic flux path and the moving coil is coupled to a moving diaphragm which moves in response to the moving coil control signal.

In accordance with another embodiment, there is provided an acoustic transducer that includes an audio input terminal, a driver, a control system, and a combiner component, and a filter component. The audio input terminal receives an input audio signal. The driver includes a moving diaphragm; a magnetic material having an air gap; a stationary coil for inducing magnetic flux in the magnetic material and the air gap; and a moving coil coupled to the diaphragm, wherein the moving coil is disposed at least partially within the air gap. The control system is adapted to generate a time-varying stationary coil signal based on the input audio signal; and to generate a time-varying moving coil signal based on both the time-varying stationary coil signal and the input audio signal. The combiner component adapted to provide a composite signal based on the time varying stationary coil signal and the time-varying moving coil signal. The filter component is adapted to process the composite signal to (i) provide a stationary coil control signal to the stationary coil, wherein the stationary coil control signal corresponds to one of the time-varying stationary coil signal and the time-varying moving coil signal and (ii) provide a moving coil control signal to the moving coil. The moving coil control signal corresponds to the other of the time varying stationary coil signal and the time-varying moving coil signal. The diaphragm moves in response to the moving coil control signal. The combiner component and the filter component are in electrical communication via a pair of conductors for transmitting the composite signal from the combiner component to the filter component.

In accordance with some embodiments, there is provided a method of operating an acoustic transducer. The method includes receiving an input audio signal and generating a time-varying stationary coil signal based on the input audio signal. The method further includes generating a time-varying moving coil signal based on both the time-varying stationary coil signal and the input audio signal and providing a composite signal based on the time-varying stationary coil signal and the time-varying moving coil signal.

In accordance with some embodiments, there is provided a method of operating an acoustic transducer. The method includes receiving, via a pair of conductors, a composite signal corresponding to a time-varying stationary coil signal and a time-varying moving coil signal, wherein the time-varying stationary coil signal is generated based on an input audio signal and the time-varying moving coil signal is generated based on both the time-varying stationary coil signal and the input audio signal. The method further includes applying a filter process to the composite signal to (i) provide a stationary coil control signal to a stationary coil, wherein the stationary coil induces a magnetic flux in a magnetic flux path and the stationary coil control signal corresponds to one of the time-varying stationary coil signal and the composite signal; and (ii) provide a moving coil control signal to a moving coil. The moving coil control signal corresponds to the other of the time-varying stationary coil signal and the composite signal. The moving coil is disposed within the magnetic flux path. The moving coil is coupled to a moving diaphragm which moves in response to the moving coil control signal.

In accordance with some embodiments, there is provided a method of operating an acoustic transducer. The method includes receiving, via a pair of conductors, a composite signal corresponding to a time-varying stationary coil signal and a time-varying moving coil signal, the time-varying stationary coil signal is generated based on an input audio signal and the time-varying moving coil signal is generated based on both the time-varying stationary coil signal and the input audio signal. The method further includes applying a filter process to the composite signal to (i) provide a stationary coil control signal to a stationary coil, wherein the stationary coil control signal corresponds to one of the time-varying stationary coil signal and the time-varying moving coil signal and the stationary coil induces a magnetic flux in a magnetic flux path and (ii) provide a moving coil control signal to a moving coil. The moving coil control signal corresponds to the other of the time-varying stationary coil signal and the time-varying moving coil signal. The moving coil is disposed within the magnetic flux path and the moving coil is coupled to a moving diaphragm which moves in response to the moving coil control signal.

Other features of various aspects and embodiments are described below.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

FIG. 3A to 3D are various example configurations of a power amplifier component for the acoustic transducer of FIG. 2.

Various features of the drawings are not drawn to scale in order to illustrate various aspects of the embodiments described below. In the drawings, corresponding elements are, in general, identified with similar or corresponding reference numerals.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
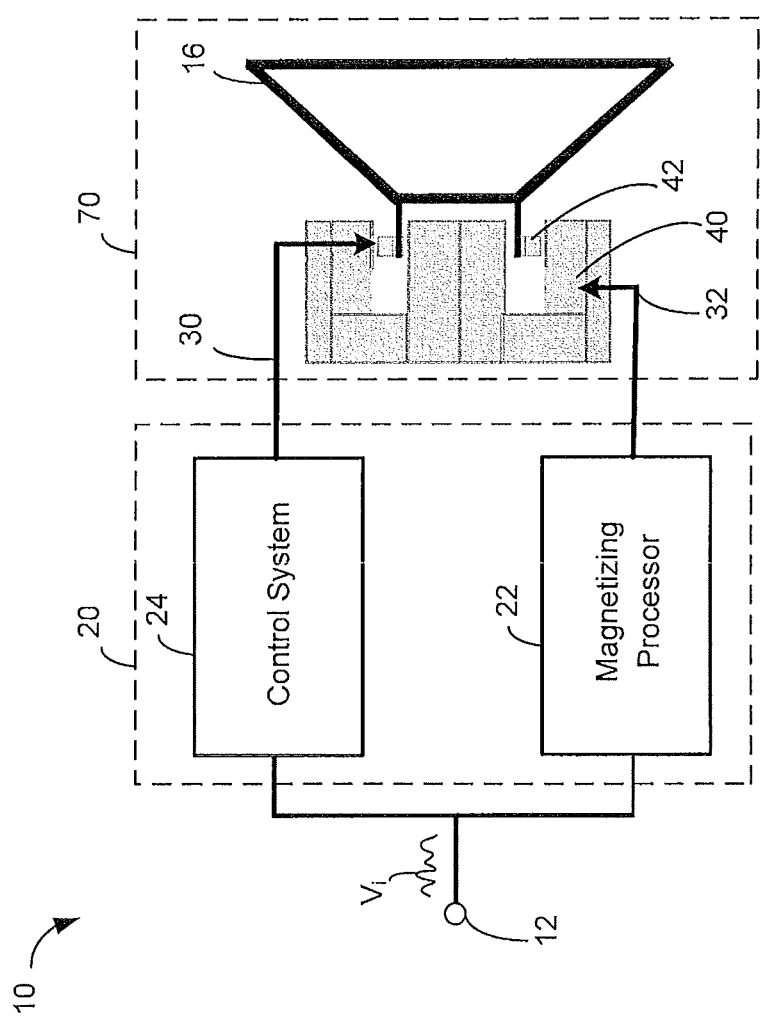
FIG. 1 illustrates an example electromagnet-based acoustic transducer.

Referring first to FIG. 1, which shows an example electromagnet-based acoustic transducer system 10. Electromagnet-based acoustic transducers can be provided by integrating a magnetizing processor 22 into a control system 24 of the acoustic transducer 70 to provide a modified control system 20. As shown in FIG. 1, the acoustic transducer 70 includes a driver 16, a stationary coil 40 and a moving coil 42. The magnetizing processor 22 generates a stationary coil signal for the stationary coil 40 based on an input audio signal V~ received at an input terminal 12.

By adding the magnetizing processor 22, additional electrical connections are needed for transmitting the stationary coil signal from the modified control system 20 to the acoustic transducer 70. As shown in FIG. 1, the magnetizing processor 22 provides the stationary coil signal to the stationary coil 40 via a pair of connections 32 and the control system 24 provides a moving coil signal to a moving coil 42 via another pair of connections 30.

The additional electrical connections 32 can lead to certain disadvantages, such as an increase in cost and complexity to provide additional conductors. In many existing systems, an audio amplifier is coupled to a magnet-based audio transducer through a single pair of conductors. To replace the magnet-based transducer with acoustic transducer system 10, a second pair of conductors must be installed.

For example, automobiles are traditionally designed to provide only a pair of connections, such as connections 30, between the control system 24 and the driver 16. Therefore, requiring a second pair of connections, such as connections 32, to accommodate the modified control system 20 of the acoustic transducer system 10 would require changes to wiring arrangements and harnesses of existing audio systems in such automobiles. Also, when new components, such as the connections 32, are introduced to certain audio systems, such as those in automobiles, reliability and operational requirements associated with those audio systems may require even more components to be included into the acoustic transducer system 10. Further diagnostic tests on the new connections 32 and the new reliability related components may also be required. As a result, the inclusion of the electrical connections 32 can lead to a more complex design for the acoustic transducer system 10.

Figure 2:
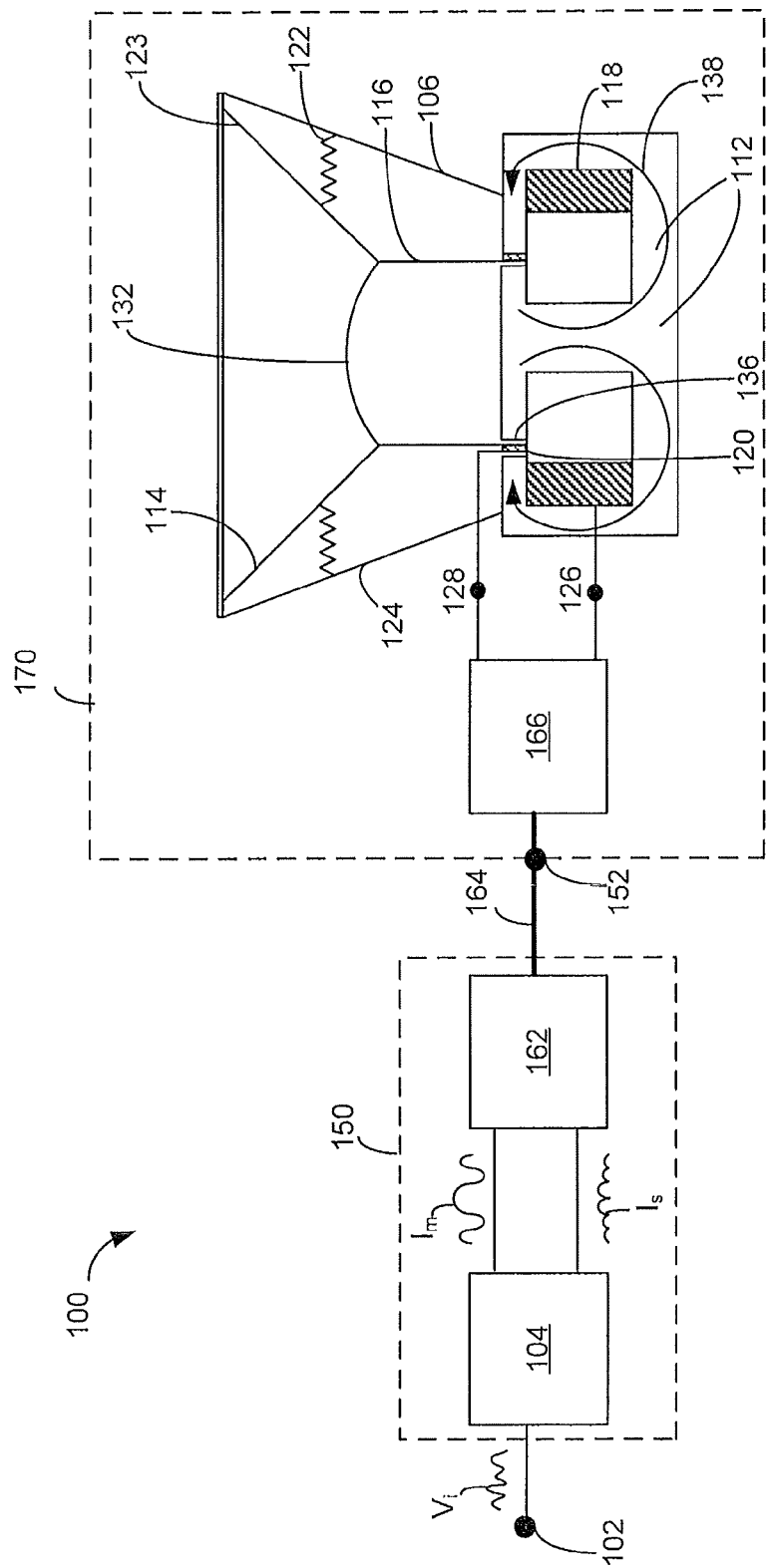
FIG. 2 illustrates an acoustic transducer in accordance with an example embodiment.

Reference is now made to FIG. 2, which illustrates an example embodiment for an acoustic transducer system 100. The acoustic transducer system 100 includes an input terminal 102, a signal processor block 150 coupled to the input terminal 102 and a transducer 170. The transducer 170 includes a transducer input terminal 152, a filter block 166 coupled to the transducer input terminal 152 for receiving signals from the signal processor block 150 and a driver 106. The driver 106 is shown in cross-section in FIG. 2 and the remaining parts of the transducer 170 are shown in block diagram form.

The driver 106 includes magnetic material 112, a diaphragm 114, a moving coil former 116, a stationary coil 118 and a moving coil 120. Driver 106 also includes an optional diaphragm support that includes a spider 122 and a surround 123.

The filter block 166 will typically be positioned near the driver 106. For example, in some embodiments, the filter block 166 may be mounted on or to a housing 124 of the driver 106. The housing 124 may also be referred to as a frame or basket of the driver 106.

The signal processor block 150 includes a control block 104 and a combiner block 162. As shown in FIG. 2, the combiner block 162 is in electrical communication with the filter block 166 via a pair of conductors 164. That is, unlike the previous electromagnet-based acoustic transducer system 10 which requires two pairs of connections 30 and 32, the signal processor block 150 is in electrical communication with the driver 106 via only the pair of conductors 164. The acoustic transducer system 100 can therefore be included into existing audio systems without requiring further modifications to those systems. It will be understood that certain audio systems, depending on the design of the system, may include one or more of both the acoustic transducer system 10 which require two pairs of connections 30 and 32 and the acoustic transducer system 100 which require only the connections 164.

The operation of the acoustic transducer system 100 will now be described with reference to FIGS. 2 to 3D.

In operation, an input audio signal $V_i$ is received at the input terminal 102. The input audio signal $V_i$ may then be transmitted to the control block 104 of the signal processor block 150 for processing.

The control block 104 receives the input audio signal $V_i$ and applies various processing techniques to the input audio signal $V_i$ to generate a moving coil current signal $I_m$ and a stationary coil current signal $I_s$. Versions of the moving coil current signal $I_m$ and the stationary coil current signal $I_s$ can be provided to the driver 106 in order to generate audio waves that correspond to the input audio signal $V_i$. Example implementations of the control block 104 are described in U.S. Pat. No. 8,139,816 and U.S. patent application Ser. No. 13/760,772, which are both incorporated herein by reference.

Generally, each of the stationary coil current signal $I_s$ and the moving coil current signal $I_m$ corresponds to the input audio signal $V_i$, and also correspond to one another. Both of the stationary coil current signal $I_s$ and the moving coil current signal $I_m$ are time-varying signals. That is, the magnitude of the stationary coil current signal $I_s$ and the moving coil current signal $I_m$ is not fixed at a single magnitude during operation of the acoustic transducer system 100. Changes in the stationary coil current signal $I_s$ produce different levels of magnetic flux in the magnetic material 112 and the air gap 136. Changes in the moving coil current signal $I_m$ cause movement of the diaphragm 114, producing sound corresponding to the input audio signal $V_i$.

To generate the moving coil current signal $I_m$ and the stationary coil current signal $I_s$, various configurations of the control block 104 may be used. For example, the control block 104 may include a stationary coil signal generation block and a moving coil signal generation block. Each of the stationary and moving coil signal generation blocks may be coupled to the input terminal 102. The stationary coil signal generation block can generate the stationary coil current signal $I_s$ in response to the input audio signal $V_i$ and the moving coil signal generation block can generate the moving coil current signal $I_m$ in response to at least one of the stationary coil current signal $I_s$ and the input audio signal $V_i$.

In some other embodiments, the moving and stationary coil signal generation blocks may not be coupled to one another, but one or both of the moving and stationary coil signal generation blocks may be adapted to estimate or model the moving and stationary coil current signals, $I_m$ and $I_s$, respectively, generated by the other block and then generate its own respective coil signal in response to the modeled coil signal and the input audio signal.

In some further embodiments, the control block 104 may also include a dynamic equalization block for pre-processing the input audio signal $V_i$ for at least one of the stationary coil signal generation block and the moving coil signal generation block. The dynamic equalization block can compensate for changes in the magnetic flux B in the air gap 136 that may be caused by the time-varying signals, for example. In various embodiments of acoustic transducers described herein, the control block 104 may be further adapted to operate in various manners depending on the desired performance and operation for the acoustic transducer system 100.

Referring still to FIG. 2, the control block 104 can provide the generated moving coil current signal $I_m$ and stationary coil current signal $I_s$ to the combiner block 162 instead of directly to the driver 106. The combiner block 162 can combine the moving coil current signal $I_m$ and the stationary coil current signal $I_s$ to generate a composite signal. By combining the moving coil current signal $I_m$ and the stationary coil current signal $I_s$, versions of the control signals for the moving coil 120 and the stationary coil 118, and the audio signal can be transmitted to the driver 106 using only the pair of conductors 164.

It should be noted that in order to generate the composite signal without affecting each of the moving coil current signal $I_m$ and the stationary coil current signal $I_s$, the frequency associated with each of the respective moving coil and stationary coil current signals $I_m$ and $I_s$ needs to be sufficiently separated. The design and application of the acoustic transducer system 100 can be associated with different distortion effects that can affect, at least, the frequency of each of the moving coil current signal $I_m$ and the stationary coil current signal $I_s$.

The combiner block 162 can include an adder component and a power amplifier component. The adder component receives the moving coil current signal $I_m$ and the stationary coil current signal $I_s$ from the control block 104, and operates to sum the moving coil current signal $I_m$ and the stationary coil current signal $I_s$ together to generate an initial composite signal. The power amplifier component can then receive the initial composite signal from the adder component and generate a composite signal based on that initial composite signal. The power amplifier component may be provided as one or more voltage power regulators or one or more current power regulators. Each power amplifier component can include a bidirectional regulator and a unidirectional regulator. Example configurations of the power amplifier component will now be described with reference to FIGS. 3A to 3D.

FIGS. 3A and 3B illustrate example configurations 300A and 300B, respectively, of the power amplifier component. As shown in FIG. 3A, the power amplifier component 300A includes a unidirectional current regulator 302 and a bidirectional current regulator 304 as separate components. The power amplifier component 300B in FIG. 3B, on the other hand, includes an aggregate current regulator 306 in which the unidirectional current regulator 302 and the bidirectional current regulator 304 are provided as an aggregate component.

It will be understood that different types of current regulators may be used for each of the current regulators of FIGS. 3A and 3B. Certain types of current regulators can be more efficient for the acoustic transducer system 100. For example, in some embodiments of the power amplifier component 300A of FIG. 3A, the unidirectional current regulator 302 may be a buck converter and the bidirectional current regulator 304 may be a class AB power amplifier or a class D power amplifier. The buck converter may be preferred over a linear amplifier, for example, due to the low power efficiency associated with linear amplifiers since linear amplifiers tend to lose a large amount of power when sourcing the current.

In some embodiments of the power amplifier component 300B of FIG. 3B, the aggregate current regulator 306 may be a class D power amplifier. In comparison with a class AB power amplifier, for example, the class D power amplifier is generally associated with a higher power efficiency.

FIGS. 3C and 3D illustrate example configurations 300C and 300D, respectively, of the power amplifier component. As shown in FIG. 3C, the power amplifier component 300C includes a unidirectional voltage regulator 312 and a bidirectional voltage regulator 314 as separate components. The power amplifier component 300D in FIG. 3D, on the other hand, includes an aggregate voltage regulator 316 in which the unidirectional voltage regulator 312 and the bidirectional voltage regulator 314 are provided as an aggregate component.

Similar to the power amplifier components 300A and 300B, different types of voltage regulators may be used in the power amplifier components 300C and 300D. For example, in some embodiments of the power amplifier component 300C of FIG. 3C, the unidirectional voltage regulator 312 may be a buck converter and the bidirectional voltage regulator 314 may be a class D power amplifier. As noted, the buck converter may be preferred over a linear amplifier since linear amplifiers tend to lose a large amount of power when sourcing the current. The combination of a buck converter in series with a class AB power amplifier can also lead to an inefficient system.

In some embodiments of the power amplifier component 300D of FIG. 3D, the aggregate voltage regulator 316 may be a class D power amplifier.

Referring again to FIG. 2, after the combiner block 162 generates the composite signal for the moving coil current signal $I_m$ and the stationary coil current signal $I_s$, the composite signal is transmitted to the filter block 166 via the pair of conductors 164. The filter block 166 may then process the composite signal to derive a stationary coil control signal for the stationary coil 118 at node 126 and a moving coil control signal for the moving coil 120 at node 128. The design of the filter block 166 can vary based on the type of control signals to be provided to the stationary coil 118 and the moving coil 120, respectively. For example, the filter block 166 may operate to split the composite signal into one or more different signals, or to remove portions of the composite signal in order to derive a particular signal for the stationary coil 118 or the moving coil 120. Various embodiments of the filter block 166 are now described.

In some embodiments, the moving coil 120 may operate based on a moving coil control signal that corresponds to the stationary coil current signal $I_s$, or a version of the stationary coil current signal $I_s$, as derived from the composite signal, and the stationary coil 118 may operate based a stationary coil control signal that corresponds to the composite signal. The stationary coil 118 can operate based on the composite signal despite the presence of both the stationary coil current signal $I_s$ and the moving coil current signal $I_m$ in the composite signal since the stationary coil current signal $I_s$ is a slow waveform that can be ignored without substantially affect the sound wave generated by the driver 106.

In order to provide the moving coil control signal to the moving coil 120, the filter block 166 can include a direct current (DC) blocking filter for deriving the stationary coil current signal $I_s$ from the composite signal. The DC blocking filter may be implemented with a capacitor at the moving coil 120, for example. It will be understood that other implementations of the DC blocking filter may be used for removing the portion of the moving coil current signal $I_m$ from the composite signal. This implementation of the filter block 166 is therefore cost-effective since only the DC blocking filter is required and the DC blocking filter is relatively simple to implement.

Alternatively, in some embodiments, the moving coil 120 may instead operate based on a moving coil control signal that corresponds to the composite signal, and the stationary coil 118 may operate based on a stationary coil control signal that corresponds to the stationary coil current signal $I_s$, or a version of the stationary coil current signal Is derived from the composite signal. Similarly, the filter block 166 can include the DC blocking filter at the stationary coil 118 for deriving the stationary coil current signal $I_s$ from the composite signal for the stationary coil 118.

In some other embodiments, the moving coil 120 may operate based on a moving coil control signal that corresponds to the moving coil current signal $I_m$, or a version of the moving coil current signal $I_m$ derived from the composite signal, and the stationary coil 118 may operate based on a stationary coil control signal that corresponds to the stationary coil current signal $I_s$, or a version of the stationary coil current signal $I_s$ derived from the composite signal.

As noted, the filter block 166 can include the DC blocking filter at the stationary coil 118 for deriving the stationary coil current signal Is from the composite signal.

To derive the moving coil current signal $I_m$ from the composite signal, the filter block 166 can further include an alternating current (AC) blocking filter at the moving coil 120. Various implementations of the AC blocking filter may be used. The AC blocking filter may be provided with a capacitor and one or more inductors. For example, the AC blocking filter may be an inductor, a combination of a capacitor and an inductor, or a combination of two inductors and a capacitor. It will be understood that other example implementations of the AC blocking filter may be used.

Alternatively, in some embodiments, the moving coil 120 may instead operate based on a moving coil control signal that corresponds to the stationary coil current signal $I_s$, or a version of the stationary coil current signal $I_s$ derived from the composite signal, and the stationary coil 118 may operate based on a stationary coil control signal that corresponds to the moving coil current signal $I_m$, or a version of the moving coil current signal $I_m$ derived from the composite signal. The filter block 166 can therefore include the DC blocking filter at the moving coil 120 for deriving the stationary coil current signal $I_s$ from the composite signal to be provided as the moving coil control signal for the moving coil 120 and the AC blocking filter at the stationary coil 118 for deriving the moving coil current signal $I_m$ from the composite signal to be provided as the stationary coil control signal for the stationary coil 118.

The implementation of the acoustic transducer system 100 in which one of the moving coil 120 or the stationary coil 118 operates based on a control signal that corresponds to the moving coil current signal $I_m$ may be less desirable since inductors are required for the AC blocking filter and inductors tend to be heavier and more expensive than capacitors, which can be the only component required for implementing the DC blocking filter.

With reference still to FIG. 2, the magnetic material 112 of the transducer 170 is generally toroidal and has a toroidal cavity. The stationary coil 118 is positioned within the cavity. In various embodiments, magnetic material 112 may be formed from one or more parts, which may allow the stationary coil 118 to be inserted or formed within the cavity more easily. Magnetic material 112 is magnetized in response to the signal received from the filter block 166 at the stationary coil 118 and produces magnetic flux in the magnetic material. The magnetic material 112 has a cylindrical air gap 136 in its magnetic circuit 138 and magnetic flux flows through and near the air gap 136. It will be understood that a path along which the magnetic flux flows may be referred to as a magnetic flux path.

The magnetic material 112 may be formed of any material that is capable of becoming magnetized in the presence of a magnetic field. In various embodiments, magnetic material 112 may be formed from two or more such materials. In some embodiments, the magnetic material 112 may be formed from laminations. In some embodiments, the laminations may be assembled radially and may be wedge shaped so that the composite magnetic material is formed with no gaps between laminations.

The moving coil 120 is mounted on the moving coil former 116. The moving coil 120 is coupled to the filter block 166 for receiving the moving coil control signal from the filter block 166. The diaphragm 114 is mounted to the moving coil former 116 such that the diaphragm 114 moves together with the moving coil 120 and the moving coil former 116. The moving coil 120 and the moving coil former 116 move within the air gap 136 in response to the received signal from the filter block 166 and the magnetic flux in the air gap 136. Components of acoustic transducers that move with the moving coil former 116 may be referred to as moving components. Components that are stationary when the moving coil former 116 is in motion may be referred to as stationary components. Stationary components of the transducer 170 include magnetic material 112 and the stationary coil 118.

In various embodiments, the transducer 170 may be adapted to vent the air space between a dust cap 132 and the magnetic material 112. For example, an aperture may be formed in the magnetic material 112, or apertures may be formed in the moving coil former 116 to allow venting of the air space, thereby reducing or preventing air pressure from affecting the movement of the diaphragm 114.

The various embodiments described above are described at a block diagram level and with the use of some discrete elements to illustrate the embodiments. Embodiments of the invention, including those described above, may be implemented in a device providing digital signal processing, or a device providing a combination of analog and digital signal processing.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of operating an acoustic transducer, the method comprising:
    receiving an input audio signal;
    generating a time-varying stationary coil signal based on the input audio signal;
    generating a time-varying moving coil signal based on both the time-varying stationary coil signal and the input audio signal;
    providing a composite signal based on the time-varying stationary coil signal and the time-varying moving coil signal;
    transmitting the composite signal on a pair of conductors to a filter block;
    filtering the composite signal via the filter block to:
        provide a stationary coil control signal to a stationary coil, wherein the stationary coil induces a magnetic flux in a magnetic flux path and the stationary coil control signal corresponds to one of the time-varying stationary coil signal and the composite signal; and
        provide a moving coil control signal to a moving coil, wherein:
            the moving coil control signal corresponds to the other of the time-varying stationary coil signal and the composite signal;
            the moving coil is disposed within the magnetic flux path; and
            the moving coil is coupled to a moving diaphragm which moves in response to the moving coil control signal,
    wherein providing the composite signal further includes:
    providing a combiner block including a first regulator that is one of a current regulator and a voltage regulator,
    wherein the first regulator comprises a unidirectional component and a bidirectional component,
    wherein the unidirectional component and the bidirectional component are provided as separate components, and
    wherein:
        the first regulator is a voltage source;

the unidirectional component of the voltage source comprises a buck converter; and the bidirectional component of the voltage source comprises a class D power amplifier.

2. The method of claim 1, wherein providing the composite signal comprises adding the time-varying stationary coil signal to the time-varying moving coil signal with the combiner block to transmit the composite signal on the pair of conductors to the filter block.

3. An acoustic transducer comprising:

an audio input terminal for receiving an input audio signal;

a driver having:
- a moving diaphragm;
- a magnetic material having an air gap;
- a stationary coil for inducing magnetic flux in the magnetic material and the air gap;
- a moving coil coupled to the diaphragm, wherein the moving coil is disposed at least partially within the air gap; and a control system adapted to:
- generate a time-varying stationary coil signal based on the input audio signal; and
- generate a time-varying moving coil signal based on both the time-varying stationary coil signal and the input audio signal;

a combiner component adapted to providing a composite signal based on the time-varying stationary coil signal and the time-varying moving coil signal;

a filter component adapted to process the composite signal to:
- provide a stationary coil control signal for the stationary coil, wherein the stationary coil control signal corresponds to one of the time-varying stationary coil signal and the composite signal; and
- provide a moving coil control signal to the moving coil, wherein the moving coil control signal corresponds to the other of the time-varying stationary coil signal and the composite signal and the diaphragm moves in response to the moving coil control signal; and wherein the combiner component and the filter component are in electrical communication via a pair of conductors for transmitting the composite signal from the combiner component to the filter component, wherein the combiner component includes a first regulator that is one of a current regulator and a voltage regulator, wherein the first regulator comprises a unidirectional component and a bidirectional component, wherein the unidirectional component and the bidirectional component are provided as separate components, and wherein:
- the first regulator is a current source;
- the unidirectional component of the current source comprises a buck converter; and
- the bidirectional component of the current source comprises one of a class D power amplifier and a class AB power amplifier.

4. The acoustic transducer of claim 3, wherein the combiner component is configured to add the time-varying stationary coil signal to the time-varying moving coil signal to transmit the composite signal from the combiner component to the filter component.

5. A method of operating an acoustic transducer, the method comprising:

receiving an input audio signal;

generating a time-varying stationary coil signal based on the input audio signal;

generating a time-varying moving coil signal based on both the time-varying stationary coil signal and the input audio signal; and providing a composite signal based on the time-varying stationary coil signal and the time-varying moving coil signal, wherein providing the composite signal includes adding the time-varying stationary coil signal to the time-varying moving coil signal with a combiner block to transmit the composite signal on a pair of conductors to a transducer, wherein providing the composite signal further includes:

providing the combiner block including a first regulator that is one of a current regulator and a voltage regulator, wherein the first regulator comprises a unidirectional component and a bidirectional component, wherein the unidirectional component and the bidirectional component are provided as separate components, and wherein:
- the first regulator is a current source;
- the unidirectional component of the current source comprises a buck converter; and
- the bidirectional component of the current source comprises one of a class D power amplifier and a class AB power amplifier.

* * * * *